United States Patent
Harnay et al.

(10) Patent No.: US 9,455,729 B2
(45) Date of Patent: Sep. 27, 2016

(54) METHOD AND APPARATUS FOR AVOIDING SPURS IN CHIP

(71) Applicant: STMicroelectronics International N.V., Amsterdam (NL)

(72) Inventors: Didier Harnay, Cesson Sevigne (FR); Stephane Pineau, Chateaugiron (FR); Francois Sittler, Thoigne Fouillard (FR)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/485,887

(22) Filed: Sep. 15, 2014

(65) Prior Publication Data

US 2015/0077165 A1 Mar. 19, 2015

(30) Foreign Application Priority Data

Sep. 16, 2013 (EP) .................... 13306263

(51) Int. Cl.
*H03L 7/06* (2006.01)
*H03L 7/107* (2006.01)
*H04B 15/04* (2006.01)
*H03L 7/08* (2006.01)

(52) U.S. Cl.
CPC ........... *H03L 7/1075* (2013.01); *H03L 7/0802* (2013.01); *H04B 15/04* (2013.01)

(58) Field of Classification Search
None
See application file for complete search history.

(56) References Cited

U.S. PATENT DOCUMENTS

| 7,580,691 B1 | 8/2009 | Reed et al. |
| 2009/0080498 A1 | 3/2009 | Deisher et al. |
| 2010/0137025 A1 | 6/2010 | Tal et al. |
| 2011/0291706 A1* | 12/2011 | Bradley ........................ 327/105 |
| 2013/0069696 A1* | 3/2013 | Koerner ....................... 327/117 |

OTHER PUBLICATIONS

EPO Search Report and Written Opinion for EP 13306263 dated Jan. 22, 2014 (8 pages).

* cited by examiner

*Primary Examiner* — Cassandra Cox
(74) *Attorney, Agent, or Firm* — Gardere Wynne Sewell LLP

(57) ABSTRACT

A method is for rejecting spurs within a chip containing analog and digital functions. The spurs may be timed by a clock signal derived from the output frequency of a high frequency phase locked loop. Original analog rejection bandwidths associated with operation of analog functions may be determined, and then original spurs associated with operation of the digital functions and capable of directly or indirectly affecting the original analog rejection bandwidths may be identified. A final analog rejection bandwidth may be determined based on the original analog rejection bandwidths, and final spurs may be obtained based on the original spurs. A frequency shift of the output frequency of the high frequency phase locked loop to effectuate a rejection of the final spurs from the final analog rejection bandwidth may be determined, and the high frequency phase locked loop may be controlled to shift the output frequency by the frequency shift.

17 Claims, 5 Drawing Sheets

FIG. 3
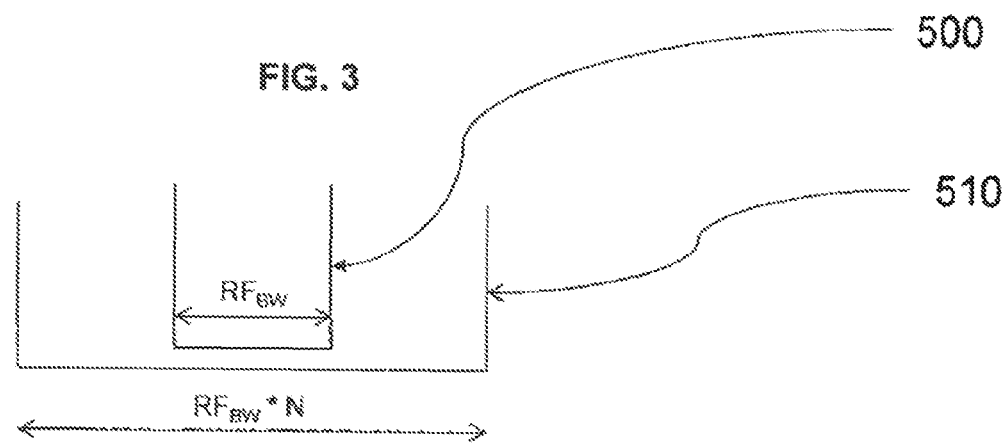
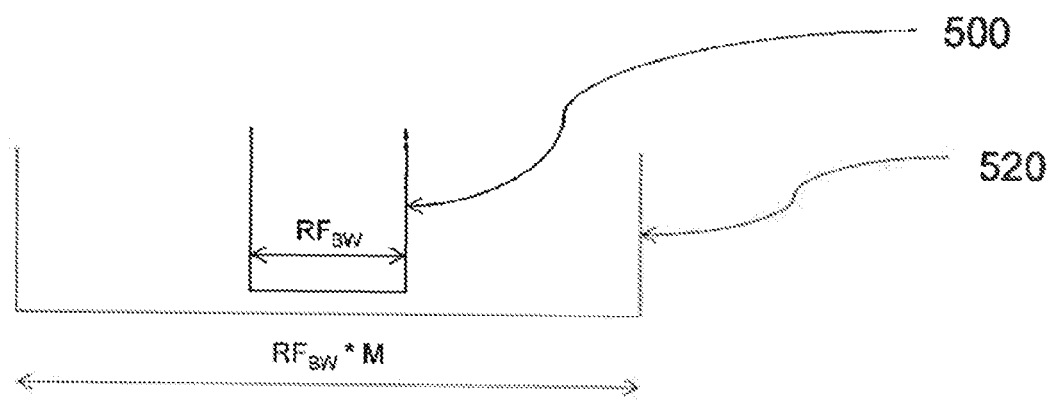

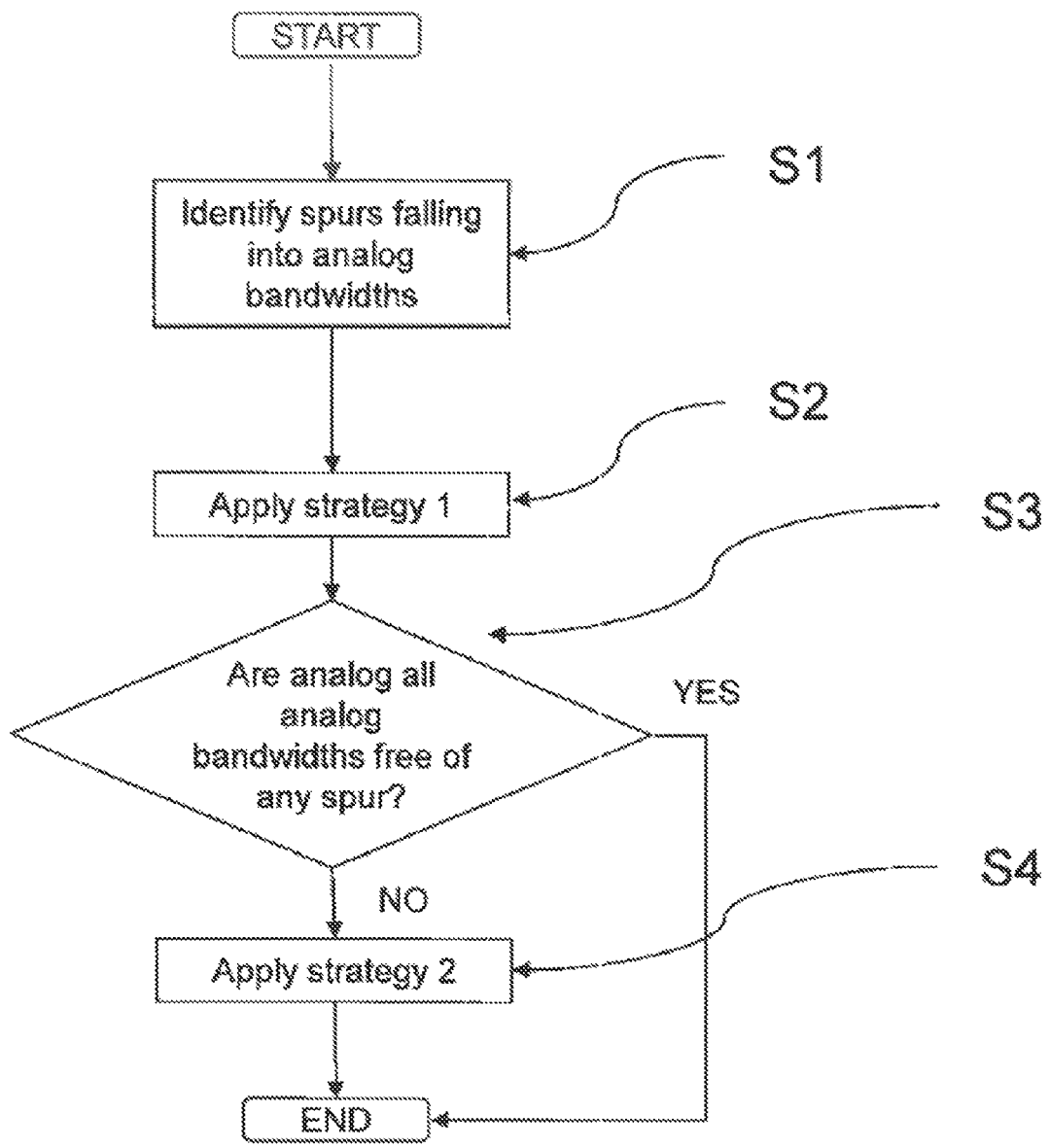

METHOD AND APPARATUS FOR AVOIDING SPURS IN CHIP

RELATED APPLICATION

This application is claims the priority benefit of European Patent Application 13306263.8, filed on Sep. 16, 2013, entitled "METHOD AND APPARATUS FOR AVOIDING SPURS IN CHIP" which is hereby incorporated by reference to the maximum extent allowable by law.

TECHNICAL FIELD

This disclosure relates to integrated circuits for wireless communications devices, and, more particularly, to frequency evasion in an integrated circuit containing analog and digital function blocks.

BACKGROUND

There is a continuous desire to reduce the silicon area of System-on-a-Chip (SoC) packages. In fact, small footprint designs are desired to be efficiently integrated into mobile phones. However, integrating analog and digital functions into a chip can cause spurious emissions (also known as "spurs") into the different analog bandwidths on the chip. More precisely, it can result in the coupling of digital spurs into the analog bandwidths (namely, both transmitter and receiver) and can severely degrade the performance of the transmitter and/or receiver. The digital spurs are mainly linked to the digital clocks and their associated harmonics propagating throughout the silicon or package, or could be the result of indirect injection, for instance coming from analog front-ends (which again may be either transmit or receive front-ends).

Thus, integrating analog and digital functions into a chip may be associated with the implementation of mitigation techniques that limit the perturbation caused by the digital spurs on the analog bandwidths. Interference Mitigation Management (IMM) techniques, such as frequency evasion may be used for this purpose. IMM techniques may include shifting the digital spurs out of the bandwidths involved in analog operations such as radio transmission. In certain implementations of such techniques, a High Frequency (HF) Phase Locked Loop (PLL) may be used to generate a digital clock signal that is further sent to one or more frequency dividers, in order to produce respective clock signals with a lower frequency. In this case, frequency evasion may be performed by changing an integer divider ratio for each digital clock, namely the ratio of each frequency divider, so as to change the corresponding clock frequency.

Disadvantageously, some issues may arise from this kind of implementation, especially when several frequency bands are to be simultaneously cleared of digital spurs. This is the case, for instance, in wireless communication systems where transmit and receive transmissions may be performed concurrently.

First, complex processing may be used to adjust the divider ratio for each digital clock during ongoing communications. Secondly, using integer clock dividers allows a limited range of available frequencies to be used, since the granularity of the available digital clocks is limited to an integer number. In addition, reducing the divider granularity imposes the desire for, at the same time, the chip be designed for coping with high clock rates, which makes its implementation complex, time consuming, and therefore costly.

Due to these difficulties, new advancements in this are desirable.

SUMMARY

Described herein is an improved frequency evasion management method to control the output frequency of a High Frequency fractional Phased Locked Loop (HF fractional PLL).

A first aspect proposes a method of rejecting spurs within a chip that may contain at least one analog function and at least one digital function, with the spurs being timed by an associated clock signal derived from the output signal of a HF, fractional PLL. The method may include determining original analog rejection bandwidths associated with the operation of analog functions, and identifying original spurs associated with the operation of the digital functions and capable of affecting the original analog rejection bandwidths directly or indirectly. A final analog rejection bandwidth may be obtained based on the original analog rejection bandwidths. The final analog rejection bandwidth may be a representation of the aggregated original analog rejection bandwidths. Similarly, final spurs may be obtained based on the original spurs. That is to say that the final spurs may be a representation of the aggregated original spurs. The method may further comprise determining a frequency shift of the output frequency of the HF fractional PLL adapted to reject the final spurs from the final analog rejection bandwidth, and controlling the HF fractional PLL so as to shift the output frequency of the HF fractional PLL by the frequency shift.

A second aspect relates to an apparatus for rejecting spurs within a chip that may contain at least one analog function and at least one digital function, with the spurs being timed by an associated clock signal derived from the output signal of a HF, fractional PLL. The apparatus may include a unit configured for determining original analog rejection bandwidths associated with the operation of analog functions, and a unit configured for identifying original spurs associated with the operation of at least the digital functions and capable of affecting the original analog rejection bandwidths directly or indirectly. A unit may be configured for obtaining a final analog rejection bandwidth based on the original analog rejection bandwidths. That is to say that the final analog rejection bandwidth may be a representation of the aggregated original analog rejection bandwidths. Similarly, a unit may be configured for obtaining final spurs based on the original spurs. That is to say that the final spurs may be a representation of the aggregated original spurs. The apparatus may also include a unit configured for determining a frequency shift of the output frequency of the HF fractional PLL adapted to reject the final spurs from the final analog rejection bandwidth, and a unit configured for controlling the HF fractional PLL so as to shift the output frequency of the HF fractional PLL by the frequency shift Thus, frequency evasion may be applied in a chip containing a plurality of both analog and digital functions, by tuning one parameter instead of several parameters. Namely, instead of changing several divider ratios, the HF fractional PLL output clock frequency may be changed in order to clear the spurs out of the analog bandwidths, with the spurs being derived from the HF fractional PLL output clock frequency.

Thus, in a chip embodying the principles of the proposed method and apparatus, a frequency evasion manager may be used to shift the output clock frequency of a HF fractional PLL so as to allow a related shift of the spurs that are derived from the HF fractional PLL. Such a fractional shift may provide a high granularity on the digital clocks derived from the HF fractional PLL a change on divider ratios, and at the same time avoid high power consumption and a complex change in conventional chip design.

In particular embodiments, the original analog rejection bandwidths may comprise at least a first analog rejection bandwidth and a second analog rejection bandwidth associated with the operation of a first and of a second analog functions, respectively, where the first analog rejection bandwidth is greater than or equal to a given analog bandwidth multiplied by N, and the second analog rejection bandwidth is greater than or equal to the given analog bandwidth multiplied by M, where N and M are real numbers greater than zero. The first analog rejection bandwidth may contain a center frequency that is equal to the center frequency of the given analog bandwidth, and the second analog rejection bandwidth may contain a center frequency that is equal to the center frequency of the given analog bandwidth multiplied by a scaling factor R, where R may be of the group of a first value for processing a receive analog frequency in low bands, a second value for processing a receive analog frequency in high bands, a third value for processing a transmit analog frequency in low bands, and a fourth value for processing a transmit analog frequency in high bands. This helps to define a relationship between the center frequencies of the given analog bandwidth and the original analog rejection bandwidths.

For instance, the original spurs associated with the operation of at least the digital functions and capable of affecting the original analog rejection bandwidths may be original spurs that, when shifted within a given range P, fall within the first analog rejection bandwidth, and original spurs that, when shifted within the given range P, fall within the second analog rejection bandwidth. This helps taking into consideration original spurs that may affect the original analog rejection bandwidths.

In particular embodiments, the final analog rejection bandwidth may be the greater bandwidth of the first analog rejection bandwidth and the second analog rejection bandwidth, where the final analog rejection bandwidth contains a final center frequency equal to the center frequency of the first analog rejection bandwidth. This helps aggregating the original analog rejection bandwidths into the final rejection bandwidth.

The final spurs may include the original spurs that are at a location from the final center frequency that is equivalent to that of the original spurs from the center frequency of the first analog rejection bandwidth, and the original spurs that are at a location from the final center frequency that is equivalent to that of the original spurs from the center frequency of the second analog rejection bandwidth divided by the scaling factor R. This may help keeping the relative distance of each original spurs while being converted into final spurs.

If desired, particular embodiments may optionally obtain the determined frequency shift that corresponds to the shift that is obtained by shifting the final spurs within the given range P such that the final spurs are completely removed from the final analog rejection bandwidth. This strategy may be well suited for chips implementing few frequency bands.

Certain embodiments may optionally obtain the determined shift that corresponds to the shift that is obtained by shifting the final spurs within the given range P such that a weighted power spectral density, PSD, calculated on the final spurs inside the final analog rejection bandwidth is minimal, wherein the weighted PSD calculation on the final spurs inside the final analog rejection bandwidth may be based on at least one of the amplitude of the final spurs, the type of analog signal conveyed in the first analog bandwidth, and physical proximity between analog and digital functions on the chip. This strategy may be well suited for chips implementing several frequency bands.

BRIEF DESCRIPTION OF THE DRAWINGS

A more complete understanding of this disclosure may be obtained from a consideration of the following description in conjunction with the drawings, in which:

FIG. 3 is a block diagram illustrating embodiments of rejection bandwidths;

FIG. 6 is a flow diagram illustrating embodiments of the proposed method.

DETAILED DESCRIPTION

Figure 1:
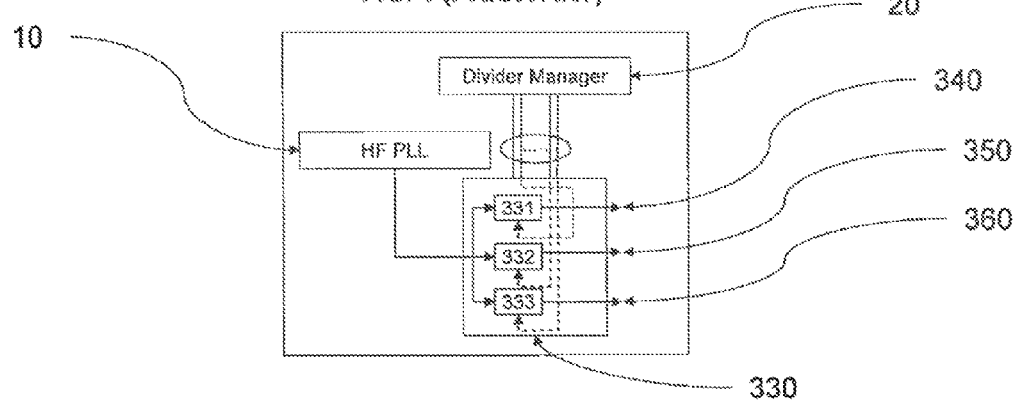
FIG. 1 is a block diagram illustrating an example of implementation of a frequency evasion manager.

FIG. 1 is a block diagram illustrating the implementation of a frequency evasion manager. It comprises a HF PLL 10 that generates an output clock frequency that is further sent to a frequency divider 330 including a plurality of integer dividers 331, 332, 333 which create a plurality of digital clocks 340, 350, 360. Each digital clock is obtained by dividing the generated output clock frequency F expressed in Hertz (Hz), by an integer N different from zero such that a digital clock is equal to F/N where N may be different for each digital clock. If integrated within a chip containing analog functions and digital functions, the generated digital clocks could interfere with the analog bandwidths containing analog signal. In this implementation, a divider manager 20 is used to change the divider ratio for each integer divider 331, 332, 333 to change the corresponding frequency of each digital clock 340, 350, 360 and thus to avoid the digital clocks from falling into the analog bandwidths.

Disadvantageously, some issues may arise from this kind of implementation, especially when several frequency bands are to be cleared simultaneously of spurs. This may be the case in wireless communication systems where concurrent transmit and receive transmissions are performed. For instance, in 3GPP GSM or 3GPP WCDMA wireless communication systems, analog transmission on the downlink (from the base station to the mobile) and on the uplink (from the mobile to the base station) happen simultaneously.

First, complex processing may be used to adjust the divider ratios of the integer dividers 331, 332, 333 for each digital clock 340, 350, 360 during ongoing communications. In fact, each digital clock 340, 350, 360 may have a different divider ratio that may be changed in order to move the corresponding digital clock 340, 350, 360 out of the analog frequency bands.

Secondly, using an integer clock divider may allow but a limited range of available frequencies to be used since the granularity of the available digital clocks 340,350,360 is limited to an integer number.

Figure 2:
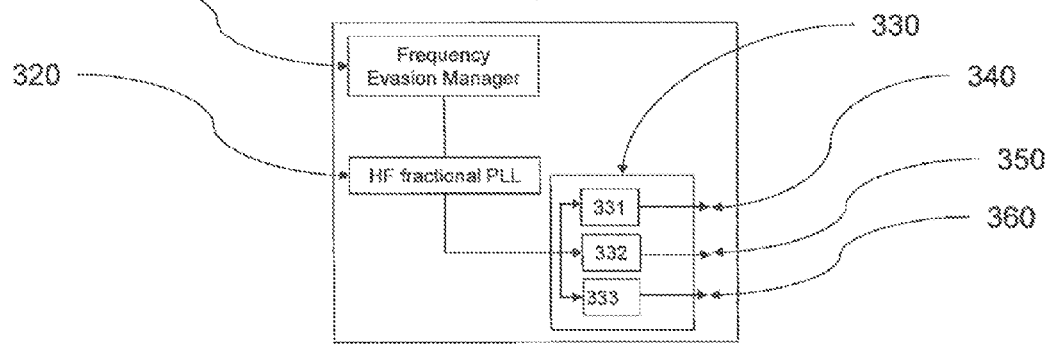
FIGS. 2 and 5 are block diagrams illustrating embodiments of the proposed apparatus.

FIG. 2 is a block diagram illustrating embodiments of a proposed apparatus. As compared to FIG. 1, the divider manager 20 is replaced by a frequency evasion manager 310 that further commands a HF fractional PLL 320. If integrated within a chip containing analog functions and digital functions, the divider ratios of the integer divider 331, 332, 333 applied to each digital clock 340, 350, 360 are no longer tuned to perform frequency evasion. Frequency evasion is performed by controlling the HF fractional PLL output clock frequency in order to shift and clear the original spurs out of the analog bandwidths. The spurs are derived from the HF fractional PLL output clock frequency.

Figure 5:
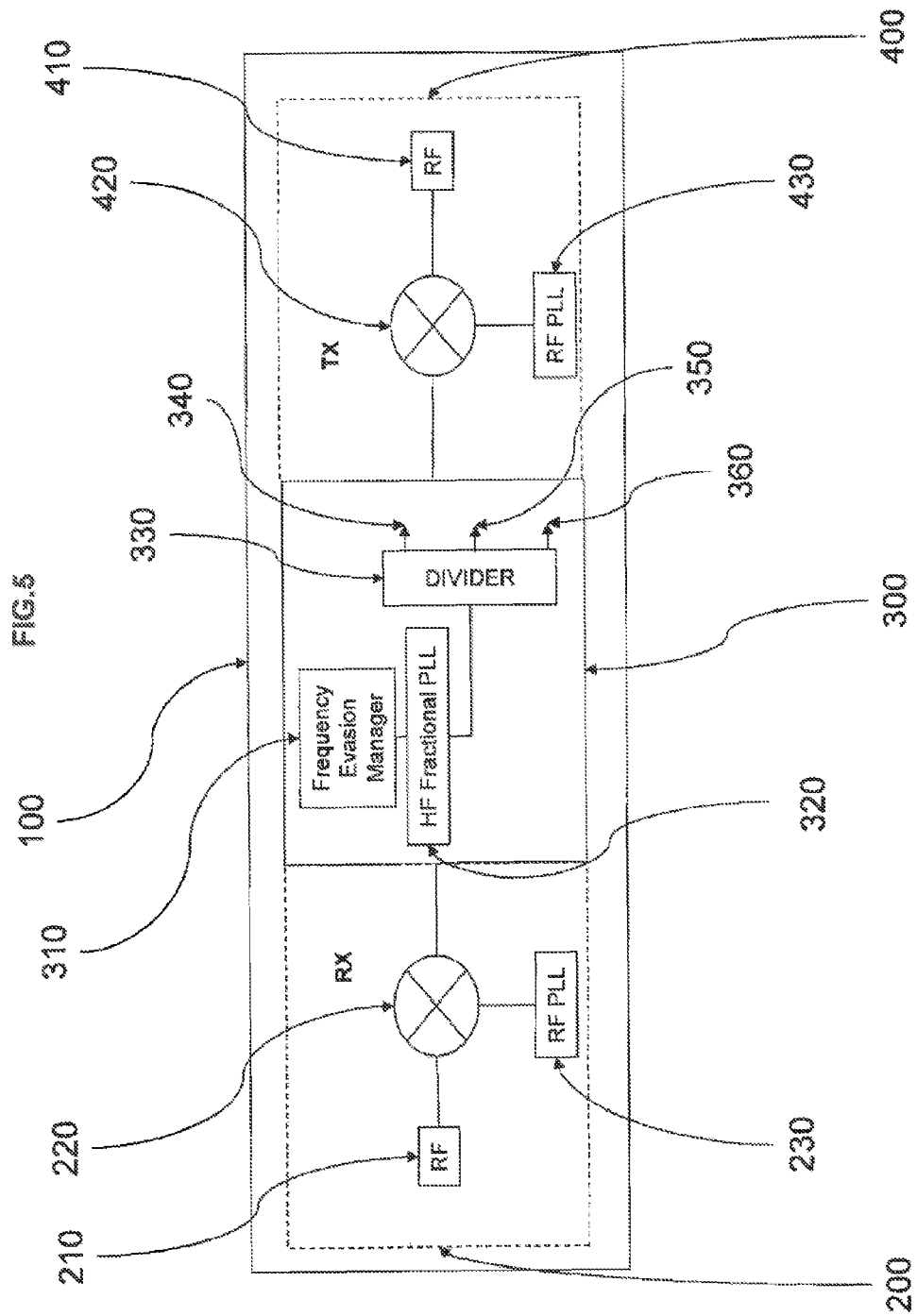

FIG. 5 is a block diagram illustrating embodiments of the proposed apparatus within a chip 100 containing analog functions and digital functions. FIG. 5 comprises receiver analog functions 200 that are at least made of a first analog function such as a receiver analog front-end 210, and a second analog function such as a receiver analog PLL 230 and a receiver mixer 220. An analog signal is received at the receiver analog front-end 210 and is further mixed by a mixer 220 with a receiver analog PLL frequency output generated by a receive analog PLL 230. FIG. 5 also includes transmitting analog functions 400 that are at least made of a first analog function such as a transmitter analog front-end 410, and a second analog function such as a transmitter analog PLL 430 and a transmitter mixer 420. An analog signal is transmitted at the transmitter analog front-end 410 after being mixed by a mixer 420 with a transmitter analog PLL frequency output generated by a transmitter analog PLL 430. FIG. 5 also includes digital functions 300 that are at least made of a HF fractional PLL 320, a frequency divider 330, and a frequency evasion manager 310. The frequency evasion manager 310 controls the HF fractional PLL output clock frequency that is further divided by the integer dividers 331, 332, 333 into digital clocks 340, 350, 360.

The HF fractional PLL 320 has the ability to have its output clock frequency be shifted by a fraction of its output clock frequency in a given range P. For instance, some implementations of such a HF fractional PLL 320 allow frequency shifts by steps of 0.01% in a range of [−10%; 10%]. Such fractional shifts provide a high granularity on the spurs that could be derived from the HF fractional PLL 320 without imposing change on divider ratios, and avoiding at the same time, high power consumption and complex change in conventional chip design.

In accordance with the proposed method and apparatus, the frequency evasion manager 310 may have the knowledge of the digital clocks 340, 350, 360 that are active in the chip 100 at a given moment in time, since the digital clocks 340, 350, 360 are derived from the HF fractional PLL 320 through the integer dividers 331, 332, 333. This helps in reducing the complexity of integration of the frequency evasion manager 310 into conventional chip design. Namely, the frequency evasion manager could be coupled to the integer divider 20 in order to have the knowledge about properties of the digital clocks 340, 350, 360.

The frequency evasion manager 310 may have the knowledge of the analog bandwidths that may be interfered directly or indirectly by digital clocks 340, 350, 360. Referring to FIG. 5, analog bandwidths of the analog front-ends 210, 410 and analog bandwidths of the analog Pas 230, 430 could be identified by the frequency evasion manager 310 as being interfered by digital clocks 340, 350, 360.

The frequency evasion manager 310 may have the knowledge of the analog rejection bandwidths 510, 520 that specify the bandwidths that should be free of any digital clocks falling into it. Referring to FIG. 3, analog rejection bandwidths of the analog front-ends could be greater than or equal to a given analog bandwidth such as the analog front-end bandwidth 500 multiplied by a real value of N that is greater than zero. Moreover, analog rejection bandwidths 520 of the analog PLLs could be greater than or equal to the given analog bandwidth, such as the analog front-end bandwidth multiplied by a real value of M that is greater than zero. It is to be noticed that real values N and M could be different values for the transmitting and the receiving functions.

Figure 4:
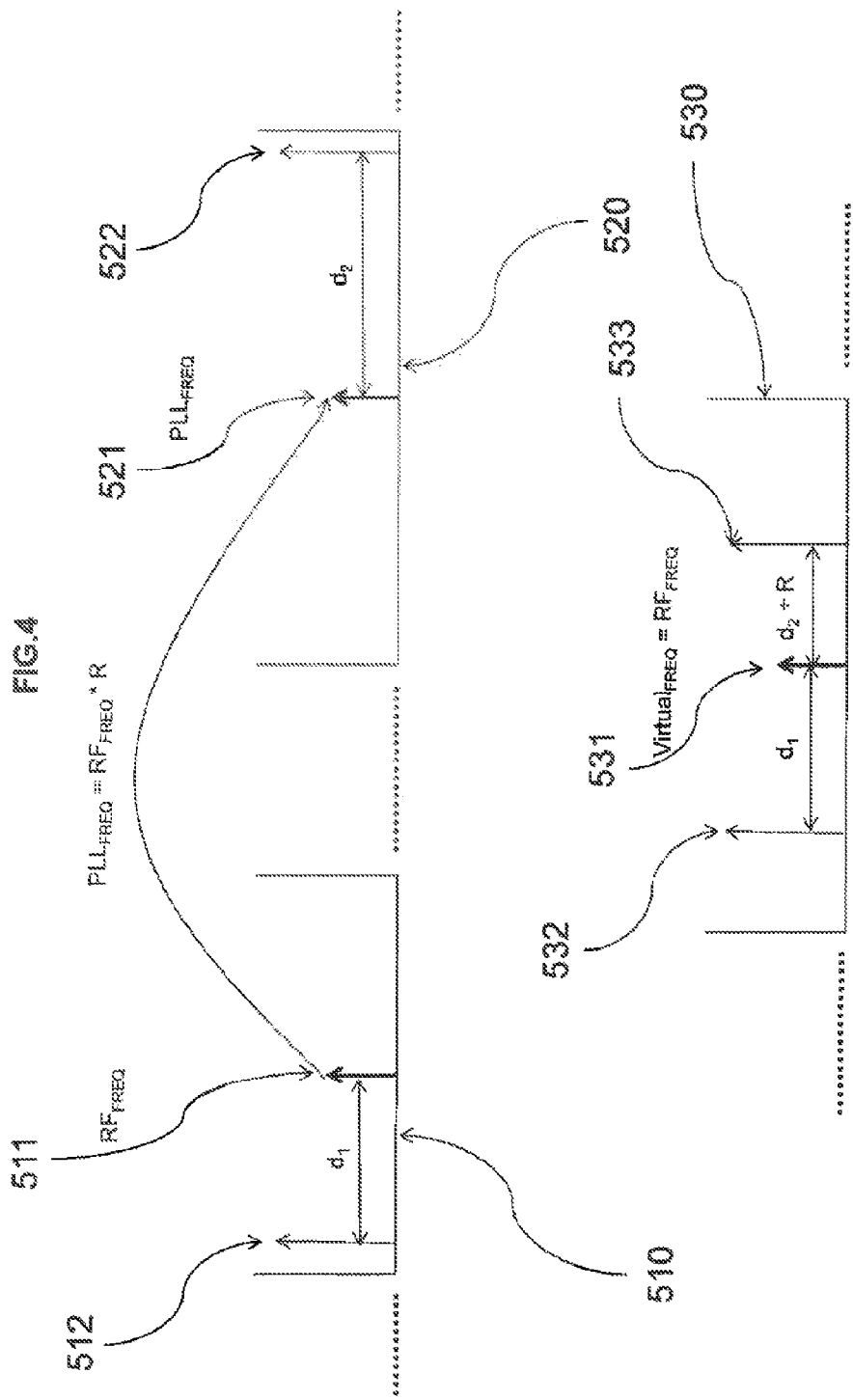
FIG. 4 is a block diagram illustrating embodiments of a final rejection bandwidth.

The frequency evasion manager may have the knowledge of the center frequency of the analog rejection bandwidths. Referring to FIG. 4, the center frequency 511 of the analog rejection bandwidth 510 of the analog front-ends could be set to the center frequency of the given analog bandwidth such as the analog front-end bandwidth depending on the transmission direction. In addition, the center frequency 521 of the analog rejection bandwidths 520 of the analog PLLs could be set to the center frequency of the given analog bandwidth such as the analog front-end bandwidth multiplied by a real value R. It should be noted that R might take either one of at least two values depending on the operated frequency bands used for the transmitting and the receiving functions. For instance, one could divide the frequency bands into high bands and low bands in the case where transmission chains are completely different, depending on the used frequency requiring different components that are frequency dependent. The high bands and low bands may be respectively greater or lower than a given frequency. An example of such value could be 1.5 GHz. In that case, R may have a first value and a second value in transmitting functions in high bands and low bands respectively. R may also have a third value and a forth value in receiving functions in high bands and low bands respectively.

Referring to FIG. 4, the frequency evasion manager may have knowledge of original spurs 512, 522 capable of affecting the analog rejection bandwidths directly or indirectly. In fact, interference that may be rejected from the analog rejection bandwidths could be direct through harmonics of the digital clocks or indirect through analog transmit and receive injections. In the latter case, a receiver analog front-end could be interfered by the output frequency of a transmitter analog PLL from the same chip and a transmitter analog front-end could be interfered by the output frequency of a receiver analog PLL 230 from the same chip. By knowing the main characteristics of the technologies implemented on the chip, such as the duplex separation between transmit and receive analog frequency bands, it is possible for the frequency evasion manager to calculate the frequencies of the interferers and identify whether they fall into the analog rejection bandwidths. While shifting the original spurs 512, 522 of the chip by shifting the HF fractional PLL output clock frequency in the given range P, the original spurs 512, 522 falling into the analog rejection bandwidths directly or indirectly are considered as the original spurs 512, 522 capable of affecting the analog rejection bandwidths directly or indirectly.

In accordance with embodiments, the frequency evasion manager may be capable of obtaining a final analog rejection bandwidth 530 based on the original analog rejection bandwidths 510, 520. The idea behind the final analog rejection bandwidth 530 is to find the suitable shift of the output frequency of the HF Fractional PLL that would clear or reduce simultaneously the unwanted original spurs 512, 522 from analog functions at the same time. In order to find the suitable shift for the analog rejection bandwidths at the same time, it could be convenient to aggregate the analog rejection bandwidths 510, 520 into a final analog rejection bandwidth 530. This final analog rejection bandwidth 530 may be the greatest bandwidth of the analog rejection bandwidths 510, 520. The final center frequency 531 of the final analog rejection bandwidth 530 may be the center frequency of the given analog rejection bandwidth such as the analog rejection bandwidth 510 of the analog front-end if the analog rejection bandwidth of the analog front-end is used for the aggregation.

In accordance with the proposed method and apparatus, the frequency evasion manager may be capable of obtaining final spurs 532, 533 based on the original spurs 512, 522. The final spurs 532 capable of affecting the final analog rejection bandwidth 530 may directly or indirectly include the original spurs 512 capable of affecting the analog rejection bandwidth 510 of the analog front-end that are at a location from the final center frequency 531 that is equivalent to that of the original spurs capable of affecting the analog rejection bandwidth 510 of the analog front-end from the center frequency 511 of the analog rejection bandwidth 511 of the analog front-end. The final spurs 533 capable of affecting the final analog rejection bandwidth 530 may directly or indirectly also include the original spurs 522 capable of affecting the analog rejection bandwidth 520 of the analog PLLs that are at a location from the final center frequency 531 that is equivalent to that of the original spurs 522 capable of affecting the analog rejection bandwidth 520 of the analog PLLs from the center frequency 521 of the analog rejection bandwidth of the analog PLLs divided by the given scaling factor R. Since R was used to calculate the center frequency of the analog rejection bandwidth 521 of the analog PLLs, it is used to keep the relative distance of the original spurs to that center frequency.

In a first embodiment, the evasion manager is able to shift the HF fractional PLL output clock frequency such that the final spurs derived from the HF fractional PLL are removed from the final analog rejection bandwidth 530. This strategy might be used mainly when the spectrum is not scarce or when there is one of a few wireless communication systems implemented into the chip. The resulted shift is a value of the given range P.

In a second embodiment, the evasion manager is able to shift the HF fractional PLL output clock frequency such that a weighted power spectral density PSD calculated on the final spurs inside the final analog rejection bandwidth 530 is minimal. This strategy might be used mainly when the spectrum is scarce, or when there are more than one wireless communication system implemented into the chip. The resulted shift is a value of the given range P. The weighted-PSD may be based on at least one of the amplitude the final spurs inside the final analog rejection bandwidth 530, the type of analog signal conveyed in the given analog 500 bandwidth such as the analog bandwidth of the analog front-ends, and the physical proximity between analog and digital functions on the chip.

FIG. 6 is a flowchart diagram illustrating embodiments of the proposed method. Depending on the embodiment, additional operations may be added, others removed, and the ordering of the steps rearranged. Referring to FIG. 6, in S1, the frequency evasion manager identifies the spurs falling into analog bandwidths of a chip as previously described. The objective is to identify the original spurs that interfere directly or indirectly with the analog signals present within these analog bandwidths. In S2, the first embodiment is applied as previously described. The objective is to try to find whether it is possible to have the analog bandwidths be cleared of spurs at the same time. This is why at S3, a control is made to verify whether the spurs have been moved out of the analog bandwidths. If it is the case, the algorithm is stopped by sending the shift calculated in S2 to the HF Fractional PLL. In the case where some spurs still remain in the analog bandwidths, in S4, the second embodiment is applied as previously described. The outcome of S4 may then be the calculated shift that may be sent to the HF Fractional PLL before stopping the algorithm.

While the proposed embodiments have been illustrated and described in details in the drawings and foregoing description, it is to be understood that the above-described illustration and description are to be considered illustrative and exemplary, and that the scope of this disclosure shall not be restricted to the disclosed embodiments. Other variations to the disclosed embodiments can be understood and effectuated by those skilled in the art from a study of the drawings, the disclosure, and the appended claims. It is therefore intended that such variations be included within the scope of the claims.

In the claims, the word "comprising" does not exclude other elements or steps, and the indefinite article "a" or "an" does not exclude a plurality. A single unit may fulfil the functions of several items recited in the claims. The mere fact that different features are recited in mutually different dependent claims does not indicate that a combination of these features cannot be advantageously used. Any reference signs in the claims should not be construed as limiting the scope of this disclosure.

The invention claimed is:

1. A method of rejecting spurs within a chip including at least one analog function and at least one digital function, the spurs being timed by a clock signal derived from an output frequency of a high frequency fractional phase locked loop, the method comprising:
   determining at least one original analog rejection bandwidth associated with operation of the at least one analog function;
   identifying original spurs associated with operation of the at least one digital function and capable of affecting the at least one original analog rejection bandwidth;
   obtaining a final analog rejection bandwidth based on the at least one original analog rejection bandwidth;
   obtaining final spurs based on the original spurs;
   determining a frequency shift of the output frequency of the high frequency fractional phase locked loop adapted to reject the final spurs from the final analog rejection bandwidth;
   wherein the frequency shift is obtained by shifting the final spurs within a given range such that a weighted power spectral density calculated on the final spurs inside the final analog rejection bandwidth is minimal; and
   controlling the high frequency fractional phase locked loop so as to shift the output frequency by the frequency shift.

2. The method of claim 1, wherein the at least one analog function comprises first and second analog functions; wherein the at least one original analog rejection bandwidth comprises a first analog rejection bandwidth and a second analog rejection bandwidth associated with operation of the first and second analog functions, respectively; wherein the first analog rejection bandwidth is greater than or equal to a given analog bandwidth multiplied by N; wherein the second analog rejection bandwidth is greater than or equal to the given analog bandwidth multiplied by M; wherein N and M are real numbers greater than zero; and wherein the first analog rejection bandwidth contains a center frequency that is equal to the center frequency of the given analog bandwidth, and the second analog rejection bandwidth contains a center frequency that is equal to the center frequency of the given analog bandwidth multiplied by a scaling factor R.

3. The method of claim 2, wherein R is selected from the group consisting of a first value for processing a receiver analog frequency in low bands, a second value for processing a receiver analog frequency in high bands, a third value for processing a transmitter analog frequency in low bands, and a fourth value for processing a transmitter analog frequency in high bands.

4. The method of claim 1, wherein the at least one analog function comprises first and second analog functions; wherein the at least one original analog rejection bandwidth comprises a first analog rejection bandwidth and a second analog rejection bandwidth associated with operation of the first and second analog functions, respectively; and wherein the original spurs associated with the operation of the at least one digital function and capable of affecting the at least one original analog rejection bandwidth comprise original spurs that, when shifted within a given range, fall within the first analog rejection bandwidth, and original spurs that, when shifted within the given range, fall within the second analog rejection bandwidth.

5. The method of claim 1, wherein the at least one analog function comprises first and second analog functions; wherein the at least one original analog rejection bandwidth comprises a first analog rejection bandwidth and a second analog rejection bandwidth associated with operation of the first and second analog functions, respectively; wherein the final analog rejection bandwidth is a greater bandwidth of the first analog rejection bandwidth and the second analog rejection bandwidth; and wherein the final analog rejection bandwidth contains a final center frequency equal to a center frequency of the first analog rejection bandwidth.

6. The method of claim 1, wherein the at least one analog function comprises first and second analog functions; wherein the at least one original analog rejection bandwidth comprises a first analog rejection bandwidth and a second analog rejection bandwidth associated with operation of the first and second analog functions, respectively; wherein the final spurs comprise the original spurs that are at a location from a final center frequency that is equivalent to that of the original spurs from a center frequency of the first analog rejection bandwidth, and the original spurs that are at a location from a final center frequency that is equivalent to that of the original spurs from a center frequency of the second analog rejection bandwidth divided by a scaling factor.

7. The method of claim 1, wherein the weighted power spectral density calculation on the final spurs inside the final analog rejection bandwidth is based on at least one of an amplitude of the final spurs, a type of analog signal conveyed in the final analog rejection bandwidth, and physical proximity between the at least one analog function and at least one digital function on the chip.

8. A method of rejecting spurs within a chip including at least one analog function and at least one digital function, the spurs being timed by a clock signal derived from an output frequency of a high frequency fractional phase locked loop, the method comprising:
    determining at least one original analog rejection bandwidth associated with operation of the at least one analog function;
    identifying original spurs associated with operation of the at least one digital function and capable of affecting the at least one original analog rejection bandwidth;
    obtaining a final analog rejection bandwidth based on the at least one original analog rejection bandwidth;
    obtaining final spurs based on the original spurs;
    determining a frequency shift of the output frequency of the high frequency fractional phase locked loop adapted to reject the final spurs from the final analog rejection bandwidth; and
    controlling the high frequency fractional phase locked loop so as to shift the output frequency by the frequency shift;
    wherein the frequency shift is obtained by shifting the final spurs within a given range such that the final spurs are removed from the final analog rejection bandwidth.

9. An apparatus for rejecting spurs within a chip including at least one analog function and at least one digital function, the spurs being timed by a clock signal derived from an output frequency of a high frequency fractional phase locked loop, the apparatus comprising:
    a frequency evasion manager configured to
        determine at least one original analog rejection bandwidth associated with operation of the at least one analog function,
        identify original spurs associated with operation of the at least one digital function and to affect the at least one original analog rejection bandwidth,
        obtain a final analog rejection bandwidth based on the at least one original analog rejection bandwidth,
        obtain final spurs based on the original spurs,
        determine a frequency shift of the output frequency of the high frequency fractional phase locked loop adapted to reject the final spurs from the final analog rejection bandwidth, and
        control the high frequency fractional phase locked loop so as to shift the output frequency by the frequency shift;
    wherein the determined frequency shift is obtained by shifting the final spurs within a given range such that a weighted power spectral density calculated on the final spurs inside the final analog rejection bandwidth is below a threshold value.

10. The apparatus of claim 9, wherein the at least one analog function comprises first and second analog functions; wherein the at least one original analog rejection bandwidth comprises at least a first analog rejection bandwidth and a second analog rejection bandwidth associated with the operation of the first and second analog functions, respectively, where the first analog rejection bandwidth is greater than or equal to a given analog bandwidth multiplied by N and the second analog rejection bandwidth is greater than or equal to the given analog bandwidth multiplied by M, where N and M are real numbers greater than zero; and wherein the first analog rejection bandwidth contains a center frequency that is equal to a center frequency of the given analog bandwidth and the second analog rejection bandwidth contains a center frequency that is equal to a center frequency of the given analog bandwidth multiplied by a scaling factor R.

11. The apparatus of claim 10, wherein R is selected from the group consisting of a first value for processing a receive analog frequency in low bands, a second value for processing a receive analog frequency in high bands, a third value for processing a transmit analog frequency in low bands, and a fourth value for processing a transmit analog frequency in high bands.

12. The apparatus of claim 9, wherein the at least one analog function comprises first and second analog functions; wherein the at least one original analog rejection bandwidth comprises at least a first analog rejection bandwidth and a second analog rejection bandwidth associated with the operation of the first and second analog functions, respectively; and wherein the original spurs associated with operation of the at least one digital function and capable of affecting the at least one original analog rejection bandwidth comprise original spurs that, when shifted within a given range, fall within the first analog rejection bandwidth, and original spurs that, when shifted within the given range, fall within the second analog rejection bandwidth.

13. The apparatus of claim 10, wherein the final analog rejection bandwidth is a greater of the first analog rejection bandwidth and the second analog rejection bandwidth; and wherein the final analog rejection bandwidth contains a final center frequency equal to a center frequency of the first analog rejection bandwidth.

14. The apparatus of claim 9, wherein the at least one analog function comprises first and second analog functions; wherein the at least one original analog rejection bandwidth comprises at least a first analog rejection bandwidth and a second analog rejection bandwidth associated with the operation of the first and second analog functions, respectively; and wherein the final spurs comprise the original spurs that are at a location from a final center frequency that is equivalent to that of the original spurs from a center frequency of the first analog rejection bandwidth, and the original spurs that are at a location from a final center frequency that is equivalent to that of the original spurs from a center frequency of the second analog rejection bandwidth divided by a scaling factor.

15. The apparatus of claim 9, wherein the weighted power spectral density calculation on the final spurs inside the final analog rejection bandwidth is based on at least one of an amplitude of the final spurs, a type of analog signal conveyed in the final analog rejection bandwidth, and physical proximity between the at least one analog function and the at least one digital function on the chip.

16. An apparatus for rejecting spurs within a chip including at least one analog function and at least one digital function, the spurs being timed by a clock signal derived from an output frequency of a high frequency fractional phase locked loop, the apparatus comprising:
a frequency evasion manager configured to determine at least one original analog rejection bandwidth associated with operation of the at least one analog function, identify original spurs associated with operation of the at least one digital function and to affect the at least one original analog rejection bandwidth, obtain a final analog rejection bandwidth based on the at least one original analog rejection bandwidth, obtain final spurs based on the original spurs, determine a frequency shift of the output frequency of the high frequency fractional phase locked loop adapted to reject the final spurs from the final analog rejection bandwidth, and control the high frequency fractional phase locked loop so as to shift the output frequency by the frequency shift;

wherein the determined frequency shift is obtained by shifting the final spurs within a given range such that the final spurs are completely removed from the final analog rejection bandwidth.

17. A method of rejecting spurs within a circuit comprising:

determining first and second analog rejection bandwidths respectively associated with first and second analog functions;

identifying a first original spur that, when shifted within a given range, falls within the first analog rejection bandwidth, and a second original spur that, when shifted within the given range, falls within the second analog rejection bandwidth;

determining a final analog rejection bandwidth based on the first and second analog rejection bandwidths;

determining at least one final spur based on the first and second original spurs; and rejecting the at least one final spur from the final analog rejection bandwidth.

* * * * *